United States Patent [19]

Takahashi et al.

[11] 4,400,438

[45] Aug. 23, 1983

[54] PROCESS FOR PRODUCING FIRE RETARDANT AND HEAT RESISTANT COPPER-CLAD LAMINATED BOARD, AND VARNISH THEREFOR

[75] Inventors: Akio Takahashi, Hitachiohta; Yutaka Itoh, Hitachi; Takeshi Shimazaki, Hitachi; Motoyo Wajima, Hitachi; Hirosada Morishita, Hitachi; Yutaka Mizuno, Shimodate; Shunya Yokozawa, Oyama; Kenji Tsukanishi, Shimodate, all of Japan

[73] Assignee: Hitachi Chemical Company, Ltd., Tokyo, Japan

[21] Appl. No.: 249,242

[22] Filed: Mar. 30, 1981

[30] Foreign Application Priority Data

Mar. 31, 1980 [JP] Japan .................................. 55-42405

[51] Int. Cl.³ ........................ B32B 15/08; B32B 31/12
[52] U.S. Cl. .................................. 428/458; 106/18.24;
156/307.3; 156/307.4; 156/307.5; 156/307.7;
156/313; 156/331.1; 156/331.5; 252/601;
428/920; 428/921; 525/66
[58] Field of Search .................. 106/18.24; 156/307.3,
156/307.4, 307.5, 313, 307.7, 331.1, 331.5;
521/82; 525/66; 428/920, 921, 458; 252/601

[56] References Cited

U.S. PATENT DOCUMENTS

| 3,075,944 | 1/1963 | Wick et al. | 260/41 |
| 3,902,951 | 9/1975 | Doi et al. | 156/313 |
| 4,193,829 | 3/1980 | Kourtides et al. | 156/276 |
| 4,266,037 | 5/1981 | DiGiulio et al. | 521/82 |

FOREIGN PATENT DOCUMENTS 55-42405 3/1980 Japan .

OTHER PUBLICATIONS

Product Information of Great Lakes Chemical Corporation for "DE-71" TM, Apr. 16, 1976.

Primary Examiner—Robert A. Dawson
Attorney, Agent, or Firm—Sprung, Horn, Kramer & Woods

[57] ABSTRACT

A process for producing a fire retardant and heat resistant copper-clad laminated board, characterized in that a maleimide resin type varnish containing a small amount of a specific halogenated diphenyl ether compound is used for impregnation of base material therewith. Copper-clad laminated boards produced according to the present invention may be so improved in fire or flame retardant properties as to be classed 94 V-0 in accordance with UL 94 (vertical burning test), and, nevertheless, are not substantially downgraded in heat resisting properties as well as copper foil peel strength.

3 Claims, No Drawings

PROCESS FOR PRODUCING FIRE RETARDANT AND HEAT RESISTANT COPPER-CLAD LAMINATED BOARD, AND VARNISH THEREFOR

This invention relates to a process for the production of a copper-clad laminated board and a copper-clad laminated board produced thereby, and a varnish used therein. More particularly, the present invention relates to a process for producing a fire or flame retardant and heat resistant copper-clad laminated board by using a maleimide resin type varnish containing a specific halogenated diphenyl ether.

Copper-clad laminated boards using an addition-crosslinked polyimide resin was predominantly used for the manufacture of such printed circuit boards, particularly multilayer printed circuit board, which are required to have excellent heat resisting properties. Polyimide resins crosslinked by an addition reaction generally have not only good heat by an addition reaction generally have not only good heat resisting properties but also good fire or flame retardant properties. However, most of such polyimide resins are not so excellent in fire retardancy as to be classed 94 V-0 as evaluated in accordance with Underwriters Laboratories' Standard 94 (vertical burning test), and even polyimide resins classed 94 V-0 are desired in some cases to have higher fire retardant properties. In addition, although polyimide resins favorably have high glass transition temperatures, they are defective in that they are poor in adhesion to copper foil, and that the precursor prepolymers thereof tend to be poor in capability of performing as the laminating resin at the time of lamination under heat and pressure. For eliminating such defects, the polyimide resins are, in some cases, modified with a modifier resin such as an epoxy resin or a cyanate resin. However, since such a modifier resin is flammable, the high fire retardancy inherent of polyimide resins is spoiled. Thus, an improvement in fire or flame retardancy of such resins used in copper-clad laminated board has been earnestly desired.

The modification of a polyimide resin with a halogenated epoxy resin or a halogenated hardener compound, or the addition of a phosphorus compound such as a phosphoric ester to a polyimide resin may be made for an improvement in fire retardancy of the polyimide resin, but adversely affects the heat resisting properties inherent of the polyimide resin. Therefore, the above-mentioned means cannot be employed for the production of highly fire retardant and heat resistant copper-clad laminated boards.

We have made extensive and intensive investigations with a view to attaining an improvement in fire or flame retardancy of copper-clad laminated boards using a polyimide type resin without sacrificing the heat resisting properties of the polyimide type resin to find that such an improvement can be attained according to a process in which a maleimide resin type varnish containing a specific halogenated diphenyl ether is employed. Thus, we have completed the present invention.

More specifically, in accordance with one aspect of the present invention, there is provided a process for producing a fire retardant and heat resistant copper-clad laminated board, which comprises the steps of:

(1) impregnating a base material with a varnish comprising a solvent, at least one maleimide compound and/or resin containing at least one maleimide group represented by the formula (I):

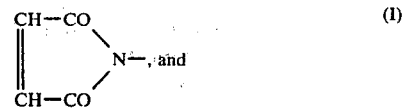

0.1 to 10% by weight, based on the resin content of the varnish, of at least one halogenated diphenyl ether compound containing at least eight halogen atoms and represented by the formula (II):

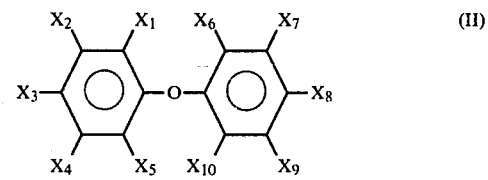

wherein $X_1$ to $X_{10}$ each independently is a chlorine atom, a bromine atom, a hydrogen atom, a methyl group, an ethyl group, an n-propyl group, an iso-propyl group or an amino group;

(2) drying the impregnated base material to prepare a prepreg; and (3) contact-bonding under heat and pressure a required number of sheets of the prepreg placed in contact relationship and one sheet of copper foil placed thereon or two sheets of copper foil sandwiching the same.

Representative examples of the base material to be used in the process of the present invention include glass fabric, nonwoven glass fabric and asbestos fabric as commonly used in heat resistant laminated boards.

Representative examples of the halogenated diphenyl ether compound of the formula (II) to be contained in the varnish that is used in the process of the present invention include 2,3,4,5,2',3',4',5'-octabromodiphenyl ether, 2,3,4,5,2',3',4',5'-octachlorodiphenyl ether, decabromodiphenyl ether, and decachlorodiphenyl ether. They may be used either alone or in mixture. Decabromodiphenyl ether is most preferred. The particle size of the halogenated diphenyl ether is preferably in the range of 0.1 to 30μ, more preferably 0.5 to 25μ, most preferably 1.0 to 20μ, in terms of 50% weight average distribution value.

Decabromodiphenyl ether is known as a fire or flame retardant capable of being used in plastics, fibers, paints and so on, and is marketed under the trade names of "Planelon DB-100 and DB-101" (DB-100: purified grade, DB-101: standad grade; both are products manufactured by Mitsui Toatsu Chemicals, Inc., Japan). However, as the fire retardants to be used in copper-clad laminated boards, decabromodiphenyl ether and similar halogenated diphenyl ethers such as 2,3,4,5,2',3',4',5'-octabromodiphenyl ether, 2,3,4,5,2',3',4',5'-octachlorodiphenyl ether and decachlorodiphenyl ether have never attracted the attention of those skilled in the art because they are solids insoluble in materials, such as any liquid resins and solvents, of varnishes used for the production of the copper-clad laminated boards, which is carried out by impregnating a base material with a varnish having a relatively low viscosity, drying the impregnated base material and contact-bonding under heat and pressure a required number of sheets of the resulting prepreg placed in contact relationship and one sheet of copper foil placed thereon or two sheets of copper foil sandwiching the same. More specifically, it has never been believed that such a varnish containing decabromodiphenyl ether or the like as can be used for the production of the copper-clad laminated boards according to the present invention can be prepared, since decabromodiphenyl ether or the like might be very difficult to disperse uniformly in the varnish and, even if uniformly dispersed, might be subject to quick precipitation because of its insolubility in the materials, such as any liquid resin and the solvent, of the varnish. This may be true especially of a varnish containing a relatively large amount of decabromodiphenyl ether or the like.

In the case of copper-clad epoxy resin laminated boards mainly used as the base boards of multilayer printed circuit boards, high fire retardancy is usually secured by the modification of the epoxy resin as the base resin with a brominated epoxy resin, which, however, downgrades drastically the heat resisting properties of the laminated boards. When decabromodiphenyl ether, which is a fire retardant of the nonreactive additive type, was tried to be used instead of the brominated epoxy resin, which is a fire retardant of the reactive type, it was found that at least 20 parts by weight, per 100 parts by weight of the resin contents, of decabromodiphenyl ether must be used for the production of a copper-clad epoxy resin laminated board having such a high fire retardancy as to be classed 94 V-0 as evaluated in accordance with UL 94 (vertical burning test). It is very difficult from a technical standpoint to disperse such a large amount of decabromodiphenyl ether uniformly in a varnish to obtain a stable dispersion. Furthermore, a considerably excessive amount of decabromodiphenyl ether must, in reality, be uniformly dispersed in a varnish to be used for the industrial scale production of such highly fire retardant copper-clad epoxy resin laminated boards when consideration is given to the amount of decabromodiphenyl ether which will settle down later in the varnish. A copper-clad epoxy resin laminated board as classed 94 V-0 was, only on a laboratory scale, prepared using a varnish containing more than 20% by weight, based on the resin content, of decabromodiphenyl ether while agitating or shaking the varnish so as to minimize the precipitation of the decabromodiphenyl ether, but was found to be of no commercial value because of its poor foggy appearance of a whitish color. Thus, it is impossible from a practical standpoint to realize a high fire retardancy of a copper-clad epoxy resin laminated board by the aid of a halogenated diphenyl ether, e.g., decabromodiphenyl ether, as used in the present invention.

When decabromodiphenyl ether was tried to be used as the fire retardant in a copper-clad phenolic resin laminated board, it was found that at least 20% by weight, based on the resin content, of decabromodiphenyl ether is needed for attaining such a high fire retardancy as can be classed 94 V-0 as evaluated in accordance with UL 94 (vertical burning test). Thus, just as in the case of a copper-clad epoxy resin laminated board, it is impossible from a practical standpoint to realize a high fire retardancy of a copper-clad phenolic resin laminated board by the aid of a halogenated diphenyl ether, e.g., decabromodiphenyl ether.

For the reasons given above, solid fire retardants of the nonreactive additive type which cannot dissolve in materials, such as any liquid resins and solvents, of varnishes have not been used in copper-clad laminated boards.

We have surprisingly found that when a maleimide resin type varnish containing only a small amount of the halogenated diphenyl ether of the formula (II) is used, copper-clad laminated boards prepared using the varnish are so excellent in fire or flame retardancy as to be classed 94 V-0 as evaluated in accordance with UL 94 (vertical burning test), and are not substantially adversely affected in respect of heat resisting properties and adhesion of base material to copper foil. Since the small amount of the halogenated diphenyl ether of the formula (II) can be uniformly and stably dispersed in the varnish, it is possible according to the present invention to produce highly fire or flame retardant copper-clad laminated boards on an industrial scale.

Thus, in accordance with another aspect of the present invention, there is provided a varnish for use in the production of copper-clad laminated boards which comprises a solvent, at least one maleimide compound and/or resin containing at least one maleimide group represented by the formula (I):

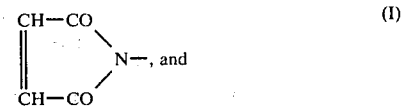

0.1 to 10% by weight, based on the resin content of the varnish, of at least one halogenated diphenyl ether compound containing at least eight halogen atoms and represented by the formula (II):

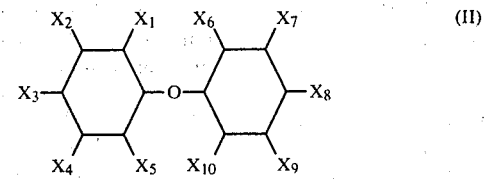

wherein $X_1$ to $X_{10}$ each independently is a chlorine atom, a bromine atom, a hydrogen atom, a methyl group, an ethyl group, an n-propyl group, an iso-propyl group or an amino group.

The amount of the halogenated diphenyl ether compound of the formula (II) to be used in the varnish of the present invention is in the range of from 0.1 to 10% by weight, preferably from 0.5 to 8% by weight, more preferably from 1.0 to 7% by weight, based on the resin content of the varnish. When the amount of the halogenated diphenyl ether is less than 0.1% by weight based on the resin content of a varnish, a sufficient improvement in fire retardancy cannot be attained in the resulting copper-clad laminated board. The use of more than 10% by weight, base on the resin content of a varnish, of the halogenated diphenyl ether is not necessary, since the use of up to 10% by weight, based on the resin content, of the halogenated diphenyl ether can attain a satisfactory effect from the practical standpoint of improvement in fire retardancy. Additionally stated, too large an amount of the halogenated diphenyl ether may adversely affect the heat resisting properties and copper foil peel strength of the resulting copper-clad laminated board.

As the solvent to be used in the varnish of the present invention, there can be mentioned, for example, dimethylformamide, N-methyl-2-pyrrolidone, dimethylacetamide, acetone, methyl ethyl ketone, 2-methoxyethanol (i.e. methyl cellosolve), 2-ethoxyethanol (i.e. ethyl cellosolve), 2-(methoxymethoxy)ethanol, 2-isopropoxyethanol, 2-(ethoxyethoxy)ethanol, 2-acetoxyethanol, 2-acetoxymethylethanol, dioxane, dimethyldioxane and propylene glycol monomethyl ether, and mixed solvents thereof.

The resin component of the varnish of the present invention comprises at least one maleimide compound and/or resin containing at least one maleimide group of the formula (I). The term "resin component" as used herein is intended to include all of those which are to constitute a cured resin which will be obtained by the subsequent curing reaction. Thus, the resin component includes a thermosetting resin, a precursor compound of thermosetting resin and a curing agent. The term "resin content" is intended to indicate the content of the above-defined resin component.

As precursor compounds and/or resins capable of constituting the resin component or being used for the preparation of a prepolymer resin to be used as or in the resin component, there can be mentioned, for example, (A) maleimide compounds, (B) amines, (C) epoxy compounds or resins, (D) phenolic resins, (E) cyanate resins, and (F) triallyl isocyanurate. The resin component is typically constituted by any of the following combinations (the precursor compounds and the resins are denoted by the above-mentioned symbols).

(i) A and B
 (a) a prepolymer of A and B, (b) a mixture of A and B
(ii) A, B and C
 (a) a mixture of A, B and C, (b) a mixture of a prepolymer of A and B with C, (c) a mixture of A with a prepolymer of B and C, or (d) a prepolymer of A, B and C
(iii) A, B and D (a basic catalyst is preferably used)
 (a) a mixture of A, B and D, (b) a mixture of a prepolymer of A and B with D, (c) a mixture of A with a prepolymer of B and D, or (d) a prepolymer of A, B and D
(iv) A and D (a basic catalyst is necessary)
 (a) a mixture of A and D, (b) a prepolymer of A and D
(v) A, B and E
 (a) a mixture of A, B and E, (b) a mixture of a prepolymer of A and B with E, (c) a mixture of A with a prepolymer of B and E, or (d) a prepolymer of A, B and E
(vi) A and E
 (a) a mixture of A and E, (b) a prepolymer of A and E
(vii) A and F (a peroxide catalyst is necessary)
 (a) a mixture of A and F, (b) a prepolymer of A and F
(viii) A, B and F (a peroxide catalyst is necessary)
 (a) a mixture of A, B and F, (b) a mixture of a prepolymer of A and B with F, (c) a mixture of A with a prepolymer of B and F, (d) a prepolymer of A, B and F The above-mentioned combinations may be either singly used or combined. In the resin component of the varnish of the present invention, one or more compounds and/or resins selected from C, D, E and F, if present, are preferably contained up to 70% by weight, more preferably up to 60% by weight, most preferably up to 55% by weight.

Examples of the maleimide compounds (A) include mono-maleimide such as N-methylmaleimide, N-ethylmaleimide, N-propylmaleimides, N-butylmaleimides, N-allylmaleimide, N-vinylmaleimide, N-phenylmaleimide, N-3-chlorophenylmaleimide, N-o-tolylmaleimide, N-m-tolylmaleimide, N-p-tolylmaleimide, N-o-methoxyphenylmaleimide, N-m-methoxyphenylmaleimide, N-p-methoxyphenylmaleimide, N-benzylmaleimide, N-pyridylmaleimide, N-hydroxyphenylmaleimide, N-acetoxyphenylmaleimide, N-dichlorophenylmaleimides, N-benzophenonemaleimides, N-diphenyletherrmaleimide, N-acetylphenylmaleimides and N-cyclohexylmaleimide; bis-maleimides such as N,N'-methylene-bis-maleimide, N,N'-ethylene-bis-maleimide, N,N'-hexamethylene-bis-maleimide, N,N'-trimethylene-bis-maleimide, N,N'-m-phenylene-bis-maleimide, N,N'-p-phenylene-bis-maleimide, N,N'-4,4'-diphenylmethane-bis-maleimide, N,N'-4,4'-diphenylether-bis-maleimide, N,N'-methylene-bis(3-chloro-p-phenylene)bis-maleimide, N,N'-4,4'-diphenylsulfone-bis-maleimide, N,N'-4,4'-dicyclohexylmethane-bis-maleimide, N,N'-α,α'-4,4'-dimethylenecyclohexane-bis-maleimide, N,N'-m-xylene-bis-maleimide and N,N'-4-diphenylcyclohexane-bis-maleimide; and polyfunctional maleimides obtained by the dehydration reaction of an amide acid formed from maleic anhydride and a polyamine prepared by the condensation of aniline with formaldehyde and represented by the formula:

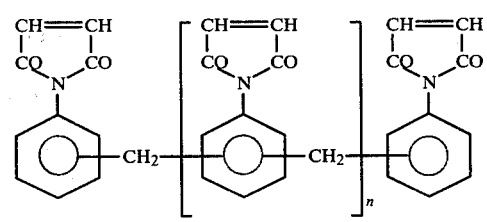

wherein n is in the range of from 0.1 to 3.0. They may be used either alone or in mixture.

Examples of the amines (B) include primary monoamines such as methylamine, ethylamine, butylamines, octylamines, cyclohexylamine, cyclohexamethylamine, aniline, chloroanilines, p-anisidine, α-naphthylamine, benzylamine, phenethylamine, 2-aminopyridine and 3-aminofuran; diprimary diamines such as guanamine, hexamethylenediamine, heptamethylenediamine, octamethylenediamine, nonamethylenediamine, 4,4'-dimethylheptamethylenediamine, 3-methoxyheptamethylenediamine, 2,10-diaminododecane, 4,4'-diaminodidyclohexylmethane, 1,4-diaminocyclohexane, 2,6-diaminopyridine, m-phenylenediamine, p-phenylenediamine, 4,4'-diaminodiphenylmethane, 4,4'-diaminodiphenylethane, 4,4'-diaminodiphenylpropane, 2,2'-bis(4-aminophenyl)propane, benzidine, 3,3'-dimethoxybenzidine, 3,3'-diaminodiphenylsulfone, 4,4'-diaminodiphenylsulfone, 4,4'-diaminodiphenyl sulfide, bis-(4-aminophenyl)methylphosphine oxide, bis(4-aminophenyl)phenylphosphine oxide, bis(4-aminophenyl)methylamine, 1,5-diaminonaphthalene, m-xylylenediamine, p-xylylenediamine, 2,6-diaminopyridine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-diamino-1,3,4-oxadiazole, 2,5-bis(m-aminophenyl)-1,3,4-oxadiazole, 2,5-bis(p-aminophenyl-1,3,4- oxadiazole, 2-(3'-aminophenyl)-5-aminobenzoxazole, 2,5-bis(m-aminophenyl)thiazolo(4,5-d)-thiazole, 5,5'-di(m-aminophenyl)-2,2'-bis(1,3,4-oxadiazolyl), 3,4'-diaminodiphenyl ether, 4,4'-diaminodiphenyl ether, 2,2'-diaminodiethyl ether, 2,2'-diaminodiethyl thioether, 3,3'-diaminodipropoxyethane, 4,4'-bis(p-aminophenyl)-2,2'-dithiazole, m-bis(4-p-aminophenyl-2-thiazolyl)benzene, 3,4'-diaminobenzanilide), 4,4'-diaminobenzanilide, 4,4'-diaminophenyl benzoate, N,N'-bis(4-aminobenzyl)-p-phenylenediamine, 4,4'-methylenebis(2-chloroaniline), p-bis(4-aminophenoxy)-benzene, m-bis(4-aminophenoxy)benzene, 4-(p-aminophenoxy)-4'-aminobenzanilide, 3,3'-dimethyl-4,4'-diaminobiphenyl, bis(p-β-amino-tert-butylphenyl)ether, 2,4-bis(β-amino-tert-butyl)toluene and di(p-aminocyclohexyl)methane; diamines with a primary amino group and a secondary amino group such as N-monomethyl-1,2-ethylenediamine, N-monohydroxyethyl-1,2-ethylenediamine, N-monomethyl-p-phenylenediamine and N-β-aminoethylpiperazine; and polyamines such as 1,2,4-triaminobenzene, 1,3,5-triaminobenzene, 2,4,6-triaminotoluene, 2,4,6-triamino-1,3,5-trimethylbenzene, 1,3,7-triaminonaphthalene, 2,4,4'-triaminodiphenyl, 2,4,6-triaminopyridine, 2,4,4'-triaminophenyl ether, 2,4,4'-triaminodiphenylmethane, 2,4,4'-triaminodiphenylsulfone, 2,4,4'-triaminobenzophenone, 2,4,4'-triamino-3-methyldiphenylmethane, N,N,N-tri(4-aminophenyl)amine, tri(4-aminophenyl)methane, phenyl 4,4',4''-triamino-orthophosphate, tri(4-aminophenyl)phosphine oxide, 3,5,4'-triaminobenzanilide, melamine, 3,5,3',5'-tetraminobenzophenone, 1,2,4,5-tetraaminobenzene, 2,3,6,7-tetraaminonaphthalene, 3,3'-diaminobenzidine, 3,3',4,4'-tetraaminodiphenylmethane, 3,3',4,4'-tetraaminodiphenylsulfone, 3,5-bis(3,4-diaminophenyl)pyridine and oligomers represented by the formula:

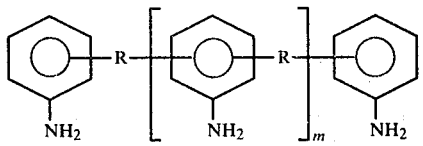

wherein m is in the range of from 0.1 to about 2, and R is a divalent hydrocarbon radical with 1 to 8 carbon atoms, which is derived from an aldehyde or a ketone. They may be used either alone or in mixture.

Examples of the epoxy compounds or resins (C) include monoepoxy compounds such as phenyl glycidyl ether; diepoxy compounds or resins such as diglycidyl ether of bisphenol A, bisphenol A-epichlorohydrin epoxy resins, 3,4-epoxycyclohexylmethyl 3,4-epoxycyclohexanecarboxylate, 4,4'-(1,2-epoxyethyl)biphenyl, 4,4'-di(1,2-epoxyethyl)diphenyl ether, resorcin diglycidyl ether, bis(2,3-epoxycyclopentyl) ether and N,N'-m-phenylenebis(4,5-epoxy-1,2-cyclohexanedicarboxyimide); and polyepoxy compounds or resins such as N,N',N''-triglycidyl isocyanurate, 1,3,5-tri(1,2-epoxyethyl)benzene, tetra-p-glycidoxytetraphenylethane, and polyglycidyl ethers of phenol-formaldehyde novolak resins and cresol-formaldehyde novolak resins such as EOCN-102 S (trade name of a cresol novolak type epoxy resin manufactured by Nihon Kayaku K.K., Japan). An epoxy compound or resin having a hydantoin skeletal structure may also be used. Examples of such an epoxy compound or resin include XB-2818 and XB-2793 (trade names of products manufactured by Ciba-Geigy AG, Switzerland). The above-mentioned epoxy compounds or resins may be used either alone or in mixture.

Examples of the phenolic resins (D) include phenolic novolak or resol resins such as condensation products of phenol and formaldehyde; cresolic novolak or resol resins such as condensation products of cresol and formaldehyde; poly-p-vinylphenol resins; diphenyl ether-modified phenolic novolak resins; and Xylok (trade mark of a product sold by Albright & Wilson Company, U.K.) which is a condensation product of phenol and p-xylylene dimethyl ether. They may be used either alone or in mixture.

An example of the cyanate resins (E) is Triazine A Resin (trade name of a product manufactured by Bayer AG, West Germany).

Triallyl isocyanurate is marketed under the trade name of TAIC (a product manufactured by Nihon Kasei Kogyo K.K., Japan).

When the varnish of the present invention includes an epoxy compound and/or resin, such as epoxy-curing agent as dicyandiamide, guanidine, tetramethylguanidine or a disecondary diamine, e.g., N,N'-dimethyl-1,6-hexamethylenediamine, N,N'-dimethyl-p-methylenedianiline, N,N'-diethyl-p-methylenedianiline, N,N'-dimethyl-p-methylenedicyclohexylamine or piperazine, may be used preferably in an amount of 0.5 to 30 parts by weight per 100 parts by weight of the epoxy compound and/or resin.

Examples of the basic catalyst that may be used in some cases include imidazole and its derivatives such as 2-ethyl-4-methylimidazole, and diethylenetriamine. Examples of the peroxide catalyst that may be used in some cases include benzoyl peroxide and methyl ethyl ketone peroxide. When the catalyst is used, the amount of the catalyst, whether it is basic or of a peroxide, is preferably 0.1 to 1.0 part by weight per 100 parts of the phenolic resin (D) or triallyl isocyanurate (F).

The varnish of the present invention preferably has a viscosity of 40 to 230 centipoises as measured at 20° C.

A specific embodiment of the process of the present invention will be explained by way of example. However, this embodiment should not be construed as limiting the scope of the invention.

A resin component, a halogenated diphenyl ether compound represented by the formula (II), and any other components are mixed with a solvent to prepare a varnish having a resin content of 40 to 70% by weight. The resin component is dissolved in the solvent. The halogenated diphenyl ether does not dissolve in the varnish, so it is uniformly dispersed in the varnish.

A base material is dipped in the varnish, and dried at 120° to 160° C. for 5 to 20 minutes to prepare a prepreg having a resin content of 30 to 55% by weight. When the base material has not been cut into sheets with a predetermined size, the prepreg thus prepared is cut into sheets with the predetermined size. A required number of sheets of the prepreg and one sheet of copper foil placed thereon or two sheets of copper foil sandwiching the same are contact-bonded at 160° to 250° C. under 30 to 80 Kg/cm² for 100 to 200 minutes, and, if desired, are subjected to post curing which may be carried out at 160° to 250° C. for 60 to 200 minutes. Thus, the desired copper-clad laminated board is produced.

Copper-clad laminated boards produced according to the present invention are improved in fire or flame retardant properties, and, nevertheless, are not substantially downgraded in heat resisting properties as well as copper foil peel strength required of heat resistant copper-clad laminated boards unlike those fire retardant copper-clad laminated boards prepared by using a halogenated epoxy resin or a phosphate ester as commonly used in the art.

The following Examples illustrate the present invention in more detail but should not be construed as limiting the scope of the invention.

EXAMPLE 1 AND COMPARATIVE EXAMPLE 1

Ingredients as listed together with their amounts in parts by weight in Table 1 except for decabromodiphenyl ether were dissolved in N-methl-2-pyrrolidone to prepare a varnish having a solids contents of 50% by weight Decabromodiphenyl ether, if present, was uniformly dispersed in the varnish since it does not dissolve in N-methyl-2-pyrrolidone.

TABLE 1

| | (parts by weight) | | | | | |
|---|---|---|---|---|---|---|
| | Example 1 | | Comparative Example 1 | | | |
| Run Nos. | 1 | 2 | 1-(a) | 1-(b) | 2-(a) | 2-(b) |
| Kerimid 601 | 60 | 50 | 60 | 60 | 50 | 50 |
| Epikote 828 | 40 | 50 | 40 | 30 | 50 | 35 |
| dicyandiamide | 2.0 | 2.5 | 2.0 | 2.0 | 2.5 | 2.5 |
| decabromodiphenyl ether | 4.0 | 6.0 | — | — | — | — |
| DER-542 | — | — | — | 10 | — | 15 |

Note
Kerimid 601: trade name of an amino-bis-maleimide type prepolymer prepared from N,N′—4,4′-diphenylmethane-bis-maleimide and 4,4′-diaminodiphenylmethane, manufactured by Rhone-Poulenc S.A., France.
Epikote 828: trade name of a bisphenol A-epichlorohydrin epoxy resin having an epoxy equivalent of 184–194, manufactured by Yuka Shell Epoxy K.K., Japan.
DER-542: trade name of a brominated bisphenol A-epichlorohydrin epoxy resin having an epoxy equivalent of 325–375 and a bromine content of 44–48% by weight, manufactured by The Dow Chemical Company, U.S.A. (DER-542 is commonly used for the production of fire retardant copper-clad epoxy resin laminated boards).

In Runs Nos. 1 and 2, decabromodiphenyl ether was used as the first retardant according to the present invention. In Runs Nos. 1 (a) and 2 (a) of Comparative Example 1, no fire retardant was used, while in Runs Nos. 1 (b) and 2 (b), a brominated epoxy resin conventionally used in the art was used as the first retardancy-providing resin.

Laminated boards were prepared by using the varnishes thus prepared, respectively, in the following manner.

Eight strips of 0.18 mm-thick aminosilane-treated glass cloth WE-18G-104BX (trade name of a glass cloth manufactured by Nittobo K.K., Japan) were impregnated with the varnish, followed by drying at 140° to 160° C. for 10 minutes, to prepare eight strips of a prepreg having a resin content of 40 to 43% by weight. The eight strips of the prepreg which had been interposed in contact relationship between two sheets of 35μ—thick electrolytic copper foil (manufactured by Furukawa Circuit Foil Co., Ltd., Japan) were contact-bonded at 170° C. under a pressure of 40 Kg/cm² for 80 minutes, followed by post-curing at 200° C. for 240 minutes, to prepare a copper-clad laminated board having a thickness of 1.6 mm.

The properties of six kinds of the copper-clad laminated boards are shown in Table 2.

TABLE 2

| | Example 1 | | Comparative Example 1 | | | |
|---|---|---|---|---|---|---|
| Run Nos. | 1 | 2 | 1-(a) | 1-(b) | 2-(a) | 2-(b) |
| copper foil peel strength (Kg/cm) | 1.7 | 1.8 | 1.7 | 0.9 | 1.8 | 1.0 |
| thermal resistance to soldering at 300° C. (seconds) | >180 | >180 | >180 | 30 | >180 | 45 |
| glass transition temperature (°C.) | 195 | 198 | 196 | 170 | 198 | 165 |
| flame-out time (seconds) | 2 (0–6) | 3 (0–8) | 23 (15–28) | 5 (0–10) | 26 (17–30) | 9 (0–15) |

Note
(1) Copper foil peel strength According to JIS (Japanese Industrial Standard) C 6481 5.7.
(2) Thermal resistance to soldering A 25 mm × 25 mm specimen was cut out from a copper-clad laminated board. The specimen was floated on a soldering bath maintained at 300° C. Time was measured until blistering or any other change appeared in the specimen.
(3) Flame-out time This was examined according to Underwriters Laboratories' Standard-94 (vertical burning test). The average flame-out time of ten specimens and the range of specimen-to-specimen variation in flame-out time (in parenthesis are found and listed in Table 2.

EXAMPLE 2 AND COMPARATIVE EXAMPLE 2

Six kinds of copper-clad laminated boards were prepared in substantially the same manner as in Example 1 and Comparative Example 1 except that respective varnishes were prepared from ingredients as listed together with their amounts in parts by weight in Table 3. The properties of the laminated boards which were examined in the same manner as in Example 1 and Comparative Example 1 are shown in Table 4.

TABLE 3

| | (Parts by weight) | | | | | |
|---|---|---|---|---|---|---|
| | Example 2 | | Comparative Example 2 | | | |
| Run Nos. | 3 | 4 | 3-(a) | 3-(b) | 4-(a) | 4-(b) |
| maleimide-A | 42 | 34 | 42 | 42 | 34 | 34 |
| 4,4′-diaminodiphenylmethane | 8 | 6 | 8 | 8 | 6 | 6 |
| EOCN-102S | 50 | 60 | 50 | 40 | 60 | 45 |
| benzoguanamine | 8 | 10 | 8 | 8 | 10 | 10 |
| 2,3,4,5,2′,3′,4′,5′-octabromodiphenyl ether | 4.5 | 6 | — | — | — | — |
| DER-511 | — | — | — | 10 | — | 15 |

Note
Maleimide-A:

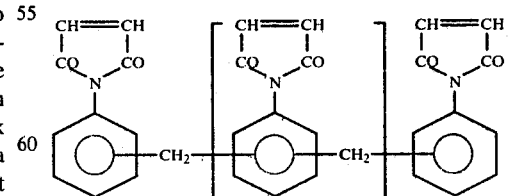

EOCN-102S: trade name of a cresol novolak type epoxy resin having an epoxy equivalent of 210-230, manufactured by Nihon Kayaku K.K., Japan.
DER-511: trade name of a brominated bisphenol A-epichlorohydrin epoxy resin having an epoxy equivalent of 445–520 and a bromine content of 18–20% by weight, manufactured by The Dow Chemical Company, U.S.A. (DER-511) is commonly used for the production of fire retardant copper-clad epoxy resin laminated boards).

TABLE 4

| Run Nos. | Example 2 | | Comparative Example 2 | | | |
|---|---|---|---|---|---|---|
| | 3 | 4 | 3-(a) | 3-(b) | 4-(a) | 4-(b) |
| copper foil peel strength (Kg/cm) | 1.9 | 2.1 | 1.9 | 0.9 | 2.0 | 1.1 |
| thermal resistance to soldering at 300° C. | >180 | >180 | >180 | 25 | >180 | 50 |
| glass transition temperature (°C.) | 195 | 205 | 200 | 175 | 205 | 170 |
| flame-out time (seconds) | 2 (0-6) | 4 (0-9) | 21 (10-28) | 6 (0-11) | 25 (12-48) | 11 (2-16) |

EXAMPLE 3 AND COMPARATIVE EXAMPLE 3

Four kinds of copper-clad laminated boards were prepared in substantially the same manner as in Example 1 and Comparative Example 1 except that respective varnishes were prepared from ingredients as listed together with their amounts in parts by weight in Table 5. The properties of the laminated boards which were examined in the same manner as in Example 1 and Comparative Example 1 are shown in Table 6.

TABLE 5

| | (parts by weight) | | | |
|---|---|---|---|---|
| | Example 3 | | Comparative Example 3 | |
| Run Nos. | 5 | 6 | 5-(a) | 6-(a) |
| N,N'—4.4'-diphenyl-methane-bis-maleimide | 60 | 55 | 60 | 55 |
| HP 607N | 40 | 45 | 40 | 45 |
| 2-ethyl-4-methyl-imidazole | 1.5 | 2.0 | 1.5 | 2.0 |
| decabromodiphenyl ether | 3 | 3 | — | — |

Note
HP 607 N: trade name of a phenolic novolak resin manufactured by Hitachi Chemical Company Ltd., Japan.

TABLE 6

| Run Nos. | Example 3 | | Comparative Example 3 | |
|---|---|---|---|---|
| | 5 | 6 | 5 | 6 |
| copper foil peel strength (Kg/cm) | 1.8 | 1.9 | 1.8 | 2.0 |
| thermal resistance to soldering at 300° C. (seconds) | >180 | >180 | >180 | >180 |
| glass transition temperature (°C.) | 250 | 220 | 250 | 220 |
| flame-out time (seconds) | 1 (0-2) | 3 (0-7) | 7 (5-20) | 12 (5-31) |

EXAMPLE 4 AND COMPARATIVE EXAMPLE 4

Two kinds of copper-clad laminated boards were prepared in substantially the same manner as in Example 1 and Comparative Example 1 except that respective varnishes were prepared from an ingredient or ingredients as listed together with their amounts in parts by weight in Table 7. The properties of the laminated boards which were examined in the same manner as in Example 1 and Comparative Example 1 are shown in Table 8.

TABLE 7

| Run Nos. | Example 4 | Comparative Example 4 |
|---|---|---|
| | 7 | 7-(a) |
| Kerimid 601 | 100 | 100 |
| decabromodiphenyl ether | 2.5 | — |

TABLE 8

| Run Nos. | Example 4 | Comparative Example 4 |
|---|---|---|
| | 7 | 7-(a) |
| copper foil peel strength (Kg/cm) | 0.9 | 0.9 |
| thermal resistance to soldering at 300° C. (seconds) | 50-60 | 50-60 |
| glass transition temperature (°C.) | 210 | 210 |
| flame-out time (seconds) | 1 (0-2) | 4.5 (4-10) |

EXAMPLE 5 AND COMPARATIVE EXAMPLE 5

Six kinds of copper-clad laminated boards were prepared in substantially the same manner as in Example 1 and Comparative Example 1 except that respective varnishes were prepared from ingredients as listed together with their amounts in parts by weight in Table 9. The properties of the laminated boards which were examined in the same manner as in Example 1 and Comparative Example 1 are shown in Table 10.

TABLE 9

| | (Parts by weight) | | | | | |
|---|---|---|---|---|---|---|
| | Example 5 | | Comparative Example 5 | | | |
| Run Nos. | 8 | 9 | 8-(a) | 8-(b) | 9-(a) | 9-(b) |
| N,N'—4,4'-diphenyl methane-bis-maleimide | 36 | 42 | 36 | 36 | 42 | 42 |
| N,N'—dimethyl-p-methylenedianiline | 10 | — | 10 | 10 | — | — |
| 4,4'diamino-diphenylmethane | 4 | 8 | 4 | 4 | 8 | 8 |
| aniline | — | 6 | — | — | 6 | 6 |
| DEN-438 | 50 | 50 | 50 | 40 | 50 | 40 |
| decabromodiphenyl ether | 4 | 4 | — | — | — | — |
| DER-511 | — | — | — | 10 | — | 10 |

Note
DEN-438: trade name of a phenolic novolak type epoxy resin having an epoxy equivalent of 180, manufactured by The Dow Chemical Company, U.S.A.

TABLE 10

| Run Nos. | Example 5 | | Comparative Example 5 | | | |
|---|---|---|---|---|---|---|
| | 8 | 9 | 8-(a) | 8-(b) | 9-(a) | 9-(b) |
| copper foil peel strength (Kg/cm) | 2.0 | 1.8 | 2.0 | 0.8 | 1.9 | 1.0 |
| thermal resistance to soldering at 300° C. (seconds) | >180 | >180 | >180 | 30 | >180 | 43 |
| glass transition temperature (°C.) | 190 | 195 | 190 | 175 | 195 | 180 |
| flame-out time (seconds) | 3 (0-8) | 2 (0-6) | 26 (10-52) | 5 (0-8) | 28 (6-50) | 7 (1-18) |

What is claimed is:

1. A process for producing a fire retardant and heat resistant copper-clad laminated board, which comprises the steps of:

(1) impregnating a base material with a varnish comprising a solvent, at least one maleimide compound and/or resin containing at least one maleimide group represented by the formula (I):

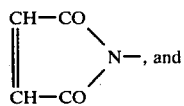

0.1 to 10% by weight, based on the resin content of the varnish, of at least one halogenated diphenyl ether compound containing at least eight halogen atoms and represented by the formula (II):

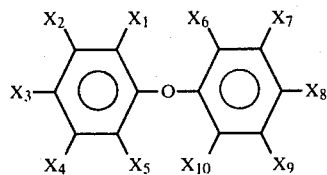

wherein $X_1$ to $X_{10}$ each independently is a chlorine atom, a bromine atom, a hydrogen atom, a methyl group, an ethyl group, an n-propyl group, an iso-propyl group or an amino group;

(2) drying the impregnated base material to prepare a prepreg; and (3) contact-bonding under heat and pressure a required number of sheets of the prepreg placed in contact relationship and one sheet of copper foil placed thereon or two sheets of copper foil sandwiching the same.

2. A copper-clad laminated board produced by a process according to claim 1.

3. A varnish for use in the production of copper-clad laminated boards which comprises a solvent, at leas one maleimide compound and/or resin containing at least one maleimide group represented by the formula (I):

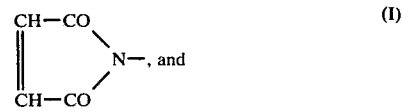

0.1 to 10% by weight, based on the resin content of the varnish, of at least one halogenated diphenyl ether compound containing at least eight halogen atoms and represented by the formula (II):

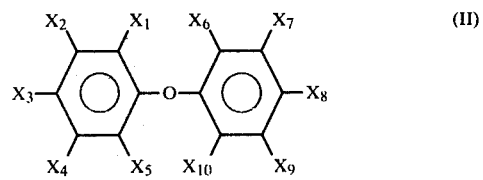

wherein $X_1$ to $X_{10}$ each independently is a chlorine atom, a bromine atom, a hydrogen atom, a methyl group, an ethyl group, an n-propyl group, an iso-propyl group or an amino group.

* * * * *